(12) United States Patent
Bhattacharya et al.

(10) Patent No.: US 7,972,938 B2
(45) Date of Patent: Jul. 5, 2011

(54) METHODS OF SPLITTING CDZNTE LAYERS FROM CDZNTE SUBSTRATES FOR THE GROWTH OF HGCDTE

(75) Inventors: Rabi S. Bhattacharya, Dayton, OH (US); Yongli Xu, Centerville, OH (US)

(73) Assignee: UES, Inc., Dayton, OH (US)

( * ) Notice: Subject to any disclaimer, the term of this patent is extended or adjusted under 35 U.S.C. 154(b) by 95 days.

(21) Appl. No.: 12/479,119

(22) Filed: Jun. 5, 2009

(65) Prior Publication Data
US 2009/0305459 A1 Dec. 10, 2009

Related U.S. Application Data

(60) Provisional application No. 61/059,022, filed on Jun. 5, 2008.

(51) Int. Cl.
*H01L 21/30* (2006.01)
*H01L 21/46* (2006.01)

(52) U.S. Cl. ......... 438/458; 257/E21.088; 257/E21.567; 257/E21.568; 438/455; 438/456; 438/457

(58) Field of Classification Search ........... 257/E21.088, 257/E21.567, E21.568; 438/455, 456, 457, 438/458
See application file for complete search history.

(56) References Cited

U.S. PATENT DOCUMENTS

| | | | |
|---|---|---|---|
| 4,072,782 A * | 2/1978 | Kramer et al. | 428/409 |
| 5,399,206 A | 3/1995 | de Lyon | |
| 5,454,885 A | 10/1995 | Dudoff et al. | |
| 6,168,967 B1 | 1/2001 | Hoffbauer et al. | |
| 6,242,324 B1 | 6/2001 | Kub et al. | |
| 6,562,127 B1 * | 5/2003 | Kud et al. | 117/94 |
| 7,041,178 B2 * | 5/2006 | Tong et al. | 148/33.4 |
| 2008/0138611 A1 * | 6/2008 | Yasuzawa et al. | 428/336 |

OTHER PUBLICATIONS

S. Stolyarova, N. Amir and Y. Nemirovsky, Rapid thermal processing of epitaxial II-VI heterostructures, Journal of Crystal Growth, vols. 198-199, Part 2, Mar. 1999, pp. 1157-1161.
Tony, Qin-Yi and Gosele, Ulrich M., Wafer Bonding and Layer Splitting for Microsystems; Advanced Materials, vol. II, No. 17, 1999, pp. 409-1425.

* cited by examiner

*Primary Examiner* — Asok K Sarkar
(74) *Attorney, Agent, or Firm* — Dinsmore & Shohl LLP

(57) ABSTRACT

Methods of producing CdZnTe (CZT) layers for the epitaxial growth of HgCdTe thereon include implanting ions into a CZT substrate at a low temperature to form a damaged layer underneath a CZT surface layer, bonding a wafer to the CZT substrate about the CZT surface layer using a bonding material, and, annealing the CZT substrate for a time sufficient to facilitate the splitting of the CZT substrate at the damaged layer from the CZT surface layer.

13 Claims, 1 Drawing Sheet

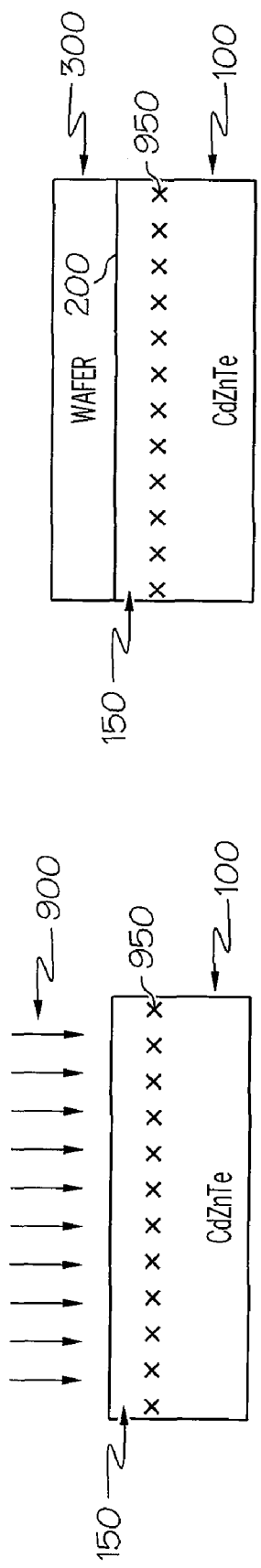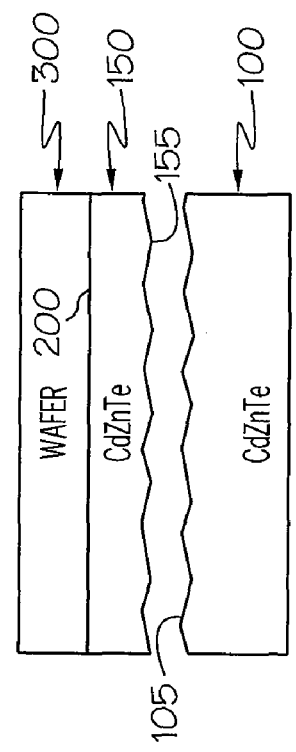

METHODS OF SPLITTING CDZNTE LAYERS FROM CDZNTE SUBSTRATES FOR THE GROWTH OF HGCDTE

CROSS-REFERENCE TO RELATED APPLICATIONS

This application claims the benefit of U.S. Provisional Application Ser. No. 61/059,022, filed Jun. 5, 2008. The aforementioned application is incorporated herein by reference in its entirety.

TECHNICAL FIELD

The present application relates generally to methods of developing substrates for use in the epitaxial growth of crystals, and in particular, to a method of growing CdZnTe substrates on silicon wafers for use in the epitaxial growth of Mercury Cadmium Telluride (HgCdTe) by crystal slicing. Other objects will be apparent in light of the description of the invention embodied herein.

SUMMARY

Mercury cadmium telluride (HgCdTe) is a material widely used in many industries, such as the semiconductor and military industries. HgCdTe is an effective material for detectors in various applications, e.g., thermal imaging, weapons guidance systems, satellite surveillance, night vision, nuclear radiation and gamma ray detectors, nuclear medicine and related applications. HgCdTe is a ternary semiconductor alloy, which exhibits a wavelength cutoff proportional to the alloy composition. The actual detector in the photoconducting mode of operation is composed of a thin layer (10 to 20 μm) of HgCdTe with metallized contact pads defining the active area. Photons with energy greater than the semiconductor band-gap energy excite electrons into the conduction band, thereby increasing the conductivity of the material. The wavelength of peak response depends on the material's band-gap energy and can easily be varied by changing the alloy composition. In order to sense the change in conductivity, a bias current or voltage is required. Another mode of detection is a p-n junction that operates in a photovoltaic configuration and there is no constant voltage applied. This is the preferred mode in the modern world of focal plane arrays (FPA).

Typically, all bodies of matter, at room temperature (RT), emit IR radiation with peaks of about 10 μm, which may be detected by a band-to-band absorption mechanism in a semiconductor material with a proper band gap value. A thin film $Hg_{1-x}Cd_xTe$ with a composition with an x value of about 0.2 and a band gap of ~0.1 eV is one example of a semiconductor material with a proper band gap value.

Traditionally, HgCdTe has been produced by epitaxial growth on CdTe substrates. Epitaxial growth is a common method for growing crystalline substrates, wherein a crystal of one material grows on the crystal face of another material, such that the crystalline substrates of both materials have the same structural orientation. In the manufacturing of HgCdTe, the lattice mismatch between HgCdTe and CdTe substrates has resulted in a great number of misfit dislocations at the interface that reduce the quantum efficiency. Lattice matching impacts the quantum efficiency of IR devices, which utilize HgCdTe, and other materials such as PbSnTe.

A better lattice-matched substrate for epitaxial growth of HgCdTe is CdZnTe, but CdZnTe single crystal substrates are in limited supply and are expensive. Moreover, the HgCdTe comprises an unfavorable lattice constant, which makes lattice matching more difficult and creates challenges when producing a CdZnTe substrate. Furthermore, only a small part of the whole CdZnTe substrate is suitable for lattice matching with the HgCdTe film, thus it is more difficult to produce a large substrate area for the epitaxial growth of HgCdTe.

As more devices utilize HgCdTe, the need arises for improvements in the manufacturing CdZnTe substrates, which may be used in the epitaxial growth of HgCdTe.

Therefore, in one embodiment, a method of producing CdZnTe (CZT) layers for the epitaxial growth of HgCdTe thereon is provided. The method includes implanting ions into a CZT substrate at a low temperature to form a damaged layer underneath a CZT surface layer, bonding a wafer to the CZT substrate about the CZT surface layer using a bonding material, and, annealing the CZT substrate for a time sufficient to facilitate the splitting of the CZT substrate at the damaged layer from the CZT surface layer.

In another embodiment, a method of producing HgCdTe on a layer of CdZnTe (CZT) from a CZT substrate is provided. The method includes providing a CZT substrate, implanting ions into the CZT substrate at a low temperature, annealing the CZT substrate, splitting the CZT substrate into a plurality of CZT layers, and, producing HgCdTe via epitaxial growth onto one of the plurality of CZT layers. These and additional features and advantages will be more fully understood in view of the following detailed description.

BRIEF DESCRIPTION OF THE DRAWINGS

The embodiments set forth in the drawings are illustrative and exemplary in nature and not intended to limit the inventions defined by the claims. The following detailed description of the illustrative embodiments can be understood when read in conjunction with the following drawings in which:

FIG. 1 depicts a schematic cross-sectional diagram of ion implantation into a CdZnTe substrate;

FIG. 2 depicts a schematic cross-sectional diagram of a wafer bonded to a CdZnTe substrate with ions implanted therein; and, FIG. 3 depicts a schematic cross-sectional diagram of a CdZnTe substrate being split about the layer of implanted ions.

DETAILED DESCRIPTION

Mercury Cadmium Telluride (HgCdTe) may be produced through epitaxial growth onto a substrate such as Cadmium Zinc Telluride (CdZnTe), also referred to as CZT. CZT substrates for the epitaxial growth of HgCdTe may be formed through irradiating a CZT substrate with an ion beam causing ions to be implanted into the CZT substrate. After the irradiated ions have been implanted into the CdZnTe substrate, the substrate may undergo a thermal annealing process, which may thermally shock the substrate and cause the substrate to split into a plurality of CZT layers. The CZT layers may further be bonded to a silicon wafer at various points in the process to provide a larger substrate area for the epitaxial growth of HgCdTe. Methods for producing CZT substrates for the epitaxial growth of HgCdTe will be discussed in more detail herein.

Referring to FIG. 1, a CZT substrate 100 may be provided. The CZT substrate 100 may be of any composition sufficient to provide an effective lattice match with HgCdTe and may comprise any size practicable for use in the art. For example, the substrate may comprise crystals of a 1 cm by 1 cm dimension such as those available from Nikko Materials Co. In one exemplary embodiment, the HgCdTe for epitaxial growth may comprise $Hg_{1-x}Cd_xTe$ where x equals a value of about 0.2. In such an embodiment, the CZT may comprise $Cd_{1-y}Zn_yT$ where y possesses a value of about 0.045 which may thereby allow for the effective growth of HgCdTe thereon. This may result in a lattice match of about $\Delta a/a \sim 2 \times 10^{-4}$, where 'a' is the lattice constant of HgCdTe, and '$\Delta a$' is the difference in lattice constant between HgCdTe and CZT. It should be appreciated that this embodiment is intended to be an exemplary and non-limiting embodiment and other HgCdTe and CZT compositions, as well as lattice mismatches, may otherwise be employed.

Still referring to FIG. 1, the CZT substrate may undergo ion implantation to produce a plurality of ions implanted therein. For example, an ion beam may produce accelerated ions 900 and target them in the direction of the CZT substrate 100. The accelerated ions may then implant into the CZT substrate at a depth that may be dependent on, for example, the acceleration rate of the ions (or the amount of energy used by the ion beam), the type of ions and/or the composition of the substrate itself. A plurality of implanted ions 950 may then be disposed at a relatively uniform depth about the CZT substrate forming a damaged layer to produce what may be referred to as a CZT surface layer 150.

Ion implantation may be carried out with any suitable device (such as an accelerator) operable for producing suitable ions for implantation. The accelerator may be used to implant light, gaseous, singly charged ions such as hydrogen, helium, and boron into the substrate material to create a buried layer, called the damage layer (depicted as the implanted ions 950 in FIGS. 1 and 2). In one embodiment, co-implantation of more than one ion may further be possible (e.g. implanting both $H^+$ and $He^+$, or implanting both $H^+$ and $B^+$). The accelerator may also employ any energy operable to implant the ions at an effective depth (or at a depth operable to facilitate splitting as should be appreciated herein). For example, singly charged ions in the range of 250 keV to 3.0 MeV may be employed. In another embodiment, the ions of $H^+$ and $B^+$ at energy levels of below 200 keV may also be co-implanted into the CZT substrate 100. According to a further embodiment, the CZT surface layer 150 may comprise a thickness of about a 10 μm or greater and may be produced by using approximately 0.85 MeV H+ or 3 MeV He+ ions. In one exemplary embodiment, the accelerator may comprise the 1.7 MV Tandetron accelerator operable to produce singly charged H or He ions in the range of 250 keV to 3.0 MeV may be produced.

Furthermore, ion implantation may occur at any temperature that allows for the ions to be implanted to the desired depth. In one embodiment, ion implantation may be performed at a low temperature. Low temperature may mean at any temperature below room temperature (where room temperature may be between about 20° C. to 25° C.). The temperature may be held constant or may vary throughout the ion implantation process. For example, in one embodiment, the temperature may be lowered to about 100K (about −173° C.) before implantation begins and held relatively constant throughout the process. In another embodiment, the CdZnTe substrate may be cooled to 77K (about −196° C.) or lower during implantation or to any temperature between about −125° C. and about −225° C. In yet another embodiment, the temperature may continually change throughout the process while still providing an average temperature that is a low temperature. Without intending to be bound by a particular theory, low temperatures may help trap hydrogen in to the ion induced lattice damage sites (counteracting the relatively high hydrogen diffusivity in the material) to allow for splitting during annealing as will become appreciated later herein.

The accelerator may further be operable to handle a plurality of wafers such that multiple CZT substrates may be implanted with ions in a single run. For example, where the accelerator comprises the 1.7 MV Tandetron accelerator, up to 25 wafers (or 25 CZT substrates) may be loaded for implantation. Furthermore, the accelerator may implant ions in any available pattern and/or for any effective amount. For example, in one embodiment, the beam of ions may be scanned to provide a substantially uniform implant over the entirety of the CZT substrate. Ions may be implanted nearly normal to the surface of the CdZnTe wafer without masking or a small offset angle may further be used to prevent channeling. The implant dose may also be varied based on the size of the substrate implanted. In one embodiment, the accelerator may supply an implant in the range of about $10^{14}$ ions/cm$^2$ to about $10^{17}$ ions/cm$^2$. In a further embodiment, the energy of implantation may be adjusted to select a desired depth of penetration and therefore a pre-determined surface layer thickness.

After implantation, the CZT substrate 100 (with implanted ions 950 producing a CZT surface layer 150) may be subjected to thermal annealing at various temperatures to thermally shock the CZT substrate 100 thereby facilitating the CZT surface layer 100 to split therefrom about the plurality of implanted ions 950 (i.e., the damaged layer). Facilitating the CZT surface layer to split may comprise causing the CZT surface layer to split on its own from the thermal annealing, or may comprise allowing for the CZT surface layer 100 to split after some physical agitation after the annealing. As will be discussed in more detail below, the CZT substrate 100 may be bonded to a wafer 300 prior to annealing (as seen in FIGS. 2 and 3), the CZT substrate 100 may be bonded to a wafer after annealing, or the CZT substrate may remain independent of a wafer throughout the splitting process. In one embodiment, the annealing temperatures may comprise a temperature range of about 100° C. to about 300° C. The annealing may occur for any time period sufficient to lift-off and separate the layers. Furthermore, the annealing process may be conducted in any suitable heater or furnace known to one of ordinary skill in the art. In one embodiment, the thermal annealing process may be carried out in a programmable tube furnace, under suitable atmospheres as dictated by the phase diagram of the ternary compound. The temperature may be gradually increased at ramp rate of about 5 to about 10° C./min. The temperature may then be kept constant over a certain period of time (which, for example, may last about 6 hours or more) and may subsequently be cooled to about room temperature at ramp rates of about −5 to about −10° C./min or by means of natural cooling. Further embodiments wherein the temperatures increase or decrease at faster or slower rates may alternatively be employed. Without intending to be bound by any particular theory, at higher temperatures the implanted ions 950 may become trapped in the damage layer of the substrate thereby resulting in a build-up of internal pressure inside the substrate. This internal pressure may cause elastic deformation of the overlying damage layer and may thereby cleave the layer from the substrate.

As discussed above, the CZT substrate may be bonded to a wafer at some point throughout the overall method be it before or after annealing. The wafer may comprise any crystal structure operable to host the CZT layer such as, for example a silicon (Si) or cadmium telluride (CdTe) wafer. Referring to FIGS. 2 and 3, in one embodiment, the CZT substrate 100 may be bonded to a wafer 300 after ion implantation but before annealing. Specifically, referring to FIG. 2, after a plurality of implanted ions 950 are present in the CZT substrate 100 (forming a CZT surface layer 150), a wafer 300 may be bonded to the CZT substrate at a juncture 200. The juncture 200 may comprise where the outer surface of the CZT surface layer 150 meets the bottom surface of the wafer 300. Referring now to FIG. 3, after the CZT substrate 100 has been annealed, the CZT surface layer 150 (which is bonded to the wafer 300 at the juncture 200) may split from the CZT substrate. Specifically, a lower surface 155 of the CZT surface layer 150 may separate from the upper surface 105 of the CZT substrate 100 substantially about where the plurality of implanted ions were located. In such an embodiment, the bonding of the CZT surface layer 150 to the wafer 300 prior to annealing may help ensure the CZT surface layer 150 breaks away from the CZT substrate 100 in one contiguous piece.

Bonding may be achieved by coating the surface of the silicon wafer and/or the surface of the CZT implanted surface with bonding material. The bonding material may be operable to withstand temperatures of up to about 350° C., and may be transparent to IR bands. For example, in one embodiment, the bonding material may comprise chalcogenide glass which melts at low temperatures and is transparent at middle and far IR bands. Chalcogenide glass may comprise glass materials containing a chalcogenide element e.g. sulfur, selenium, tellurium, or combinations thereof. In one exemplary embodiment, the chalcogenide glass comprises $As_2Te_3$, which comprises a melting point of less than 300° C. In yet another exemplary embodiment, the chalcogenide glass comprises $Ge_{33}As_{12}Se_{55}$, a composition having the trade name IG 2®, produced by VITRON. IG 2 has a transition temperature of about 368° C. Chalcogenide glass may be applied in various desired amounts. For example, the chalcogenide glass may be applied to a thickness of about 3 to about 5 μm. In one other embodiment, bonding may comprise direct bonding. For example, a thin layer of $SiO_2$ or $Si_3N_4$ may be applied to the CZT implanted surface and/or the surface of the silicon wafer. The surfaces may then be exposed to a plasma to activate the bonding and such that the surfaces may be brought together (for example in the plasma chamber or in a clean room) to bond the two substrates to one another. Furthermore, in such an embodiment, the a relatively low annealing temperature may be used (for example between about 100° C. and about 200° C. to help strengthen the bond.

In one embodiment, where the bonding step is conducted before separation, the CZT substrate 100 with a plurality of implanted ions 950 may be bonded with a Si or CdTe wafer through the use of chalcogenide glass on at least one of the faces of the implanted CZT as discussed above. Subsequently, the implanted CZT substrate 100, which is bonded to the Si wafer via the chalcogenide glass coating, may be placed in the furnace at room temperature and heated until a temperature of about 150° C. to about 300° C. is reached. The furnace may, for example, operate at atmospheric or reduced pressure.

In another embodiment, bonding may be achieved by coating the juncture 200 (which may comprise coating the outer surface of the CZT surface layer 150 and/or the bottom surface of the wafer 300) with a high purity polymer resin, such as Cyclotene® which is produced by the Dow Chemical Co. The Cyclotene® resins are derived from B-staged bisbenzocyclobutene-based (BCB) monomers. This material may assist in the process because of its low cure temperature (100-300 C), good thermal stability, high optical clarity and less than 5% shrinkage during cure. Although various application processes are contemplated, the Cyclotene® resin may, for example, be spin coated onto a Si wafer or the outer surface of the CZT surface layer 150 prior to bonding.

Bonding may also be accomplished with the use of polysilazanes. Polysilazanes are polymers consisting of silicon, nitrogen, hydrogen and in some cases carbon. Such polymers may have both silicon and nitrogen atoms in their backbone (—Si—N—). For example, in one embodiment, the polysilazane may comprise a pale yellow, low viscosity liquid based coating resin that is specially designed for use in the formulation of heat-curable ceramic coatings. One suitable commercial polysilazane resin is KiON® HTT 1800 produced by the KiOn Corporation. KiON® HTT 1800 is a coating grade polysilazane resin that enables the formulation of heat-curable coatings capable of withstanding operating temperatures of 1800° F. or above. The polysilazane may rapidly solidify upon heating to 150-200° C. The cured coating may further convert from a polymer to an amorphous ceramic at temperature above 800° C. The polysilazane may also be applied on to the wafer 300 or the CZT surface layer 150 by spin coating prior to bonding and then cured.

The separated and bonded layers of CZT may then be polished by any suitable polishing method including chemical mechanical polishing (CMP). After the CZT layers are separated and bonded to the wafer, the epitaxial growth of HgCdTe may be accomplished using various suitable methods, such as MBE (Molecular Beam Epitaxy), MOCVD (Metal Organic Chemical Vapor Deposition) or LPE (Liquid Phase Epitaxy). By bonding a plurality of CZT substrates to the wafer, a larger substrate for the epitaxial growth of HgCdTe may be provided.

It is noted that terms like "specifically," "commonly," and "typically" are not utilized herein to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention. It is also noted that terms like "substantially" and "about" are utilized herein to represent the inherent degree of uncertainty that may be attributed to any quantitative comparison, value, measurement, or other representation.

Having described the invention in detail and by reference to specific embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. A method of producing CdZnTe (CZT) layers for the epitaxial growth of HgCdTe thereon, the method comprising:
   implanting ions into a CZT substrate at a low temperature to form a damaged layer underneath a CZT surface layer;
   bonding a wafer to the CZT surface layer of the CZT substrate using a bonding material, wherein the bonding material comprises chalcogenide glass or polysilazanes;
   annealing the CZT substrate for a time sufficient to facilitate the splitting of the CZT substrate at the damaged layer from the CZT surface layer.

2. The method of claim 1 wherein low temperature comprises temperatures between about −125° C. and about −225° C.

3. The method of claim 1 wherein the bonding material is chalcogenide glass.

4. The method of claim 1 wherein the bonding material is a polysilazane.

5. The method of claim 1 wherein bonding occurs before annealing or after annealing.

6. The method of claim 1 wherein implanting ions comprises a plurality of singularly charged hydrogen, helium and/or boron ions.

7. The method of claim 6 wherein implanting ions is performed with an energy of between about 250 keV and about 3.0 MeV.

8. The method of claim 1 wherein annealing comprises heating the CZT substrate with implanted ions to a temperature between 100° C. and 300° C.

9. A method of producing HgCdTe on a layer of CdZnTe (CZT) split from a substrate, the method comprising:
 providing a CZT substrate;
 implanting ions into the CZT substrate at a low temperature;
 annealing the CZT substrate;
 splitting the CZT substrate into a plurality of CZT layers; and,
 producing HgCdTe via epitaxial growth onto one of the plurality of CZT layers, wherein the one of the plurality of CZT layers is bonded to a wafer using chalcogenide glass or polysilazanes prior to producing HgCdTe via epitaxial growth.

10. The method of claim 9 wherein low temperature comprises temperatures between about −125° C. and about −225° C.

11. The method of claim 10 wherein implanting ions is performed with an energy of between about 250 keV and about 3.0 MeV.

12. The method of claim 9 wherein a CZT surface layer about the CZT substrate is bonded to the wafer prior to annealing the CZT substrate.

13. The method of claim 12 wherein the wafer comprises a silicon wafer.

* * * * *

UNITED STATES PATENT AND TRADEMARK OFFICE
CERTIFICATE OF CORRECTION

PATENT NO. : 7,972,938 B2  
APPLICATION NO. : 12/479119  
DATED : July 5, 2011  
INVENTOR(S) : Bhattacharya et al.

Page 1 of 1

It is certified that error appears in the above-identified patent and that said Letters Patent is hereby corrected as shown below:

Column 1, line 11, after "entirety." insert the following:

--This invention was made with government support under Grant Number DMI 0522039 awarded by the National Science Foundation. The government has certain rights in this invention.--;

Column 7, line 62 (Claim 2, line 2)  
"-125° C." should read -- -125°C --; and

Column 7, line 11 (Claim 8, line 3)  
"-100° C." should read -- -100°C --;

Column 8, line 7 (Claim 10, line 2)  
"-125° C." should read -- -125°C --.

Signed and Sealed this  
Tenth Day of January, 2012

David J. Kappos  
*Director of the United States Patent and Trademark Office*